United States Patent [19]

Nawaki

[11] Patent Number: 4,757,218

[45] Date of Patent: Jul. 12, 1988

[54] SEMICONDUCTOR IC DEVICE WITH WORD LINES SHIELDED FROM VOLTAGE CHANGES IN ADJACENT LINES

[75] Inventor: Masaru Nawaki, Nara, Japan

[73] Assignee: Sharp Kabushiki Kaisha, Osaka, Japan

[21] Appl. No.: 1,920

[22] Filed: Jan. 8, 1987

[30] Foreign Application Priority Data

Jan. 16, 1986 [JP] Japan .................................. 61-7352

[51] Int. Cl.[4] .......................................... H03K 17/16
[52] U.S. Cl. ................................... 307/550; 307/448; 307/542; 307/558; 307/572; 365/206
[58] Field of Search ............... 307/443, 448, 542, 549, 307/550, 557, 558, 243, 246, 572, 577, 584; 365/189, 206, 230

[56] References Cited

U.S. PATENT DOCUMENTS

| | | | |
|---|---|---|---|
| 4,259,731 | 3/1981 | Moench | 365/206 |
| 4,406,954 | 9/1983 | Proebsting | 365/206 X |
| 4,551,634 | 11/1985 | Takahashi et al. | 307/243 |
| 4,602,355 | 7/1986 | Watanabe | 365/206 |
| 4,610,002 | 9/1986 | Kaneko | 365/206 |
| 4,620,299 | 10/1986 | Remington et al. | 365/189 X |
| 4,645,944 | 2/1987 | Uya | 307/443 X |

Primary Examiner—Stanley D. Miller
Assistant Examiner—D. R. Hudspeth
Attorney, Agent, or Firm—Flehr, Hohbach, Test, Albritton & Herbert

[57] ABSTRACT

A semiconductor IC device has word lines which are sequentially arranged and each connected to the gate of a MOS transistor such that its drain and source are individually connected to the adjacent word lines. Either of these adjacent word lines is connected to a fixed potential source such that potential changes in selected one of these word lines are electrically shielded and do not affect the non-selected other word lines in the device.

10 Claims, 2 Drawing Sheets

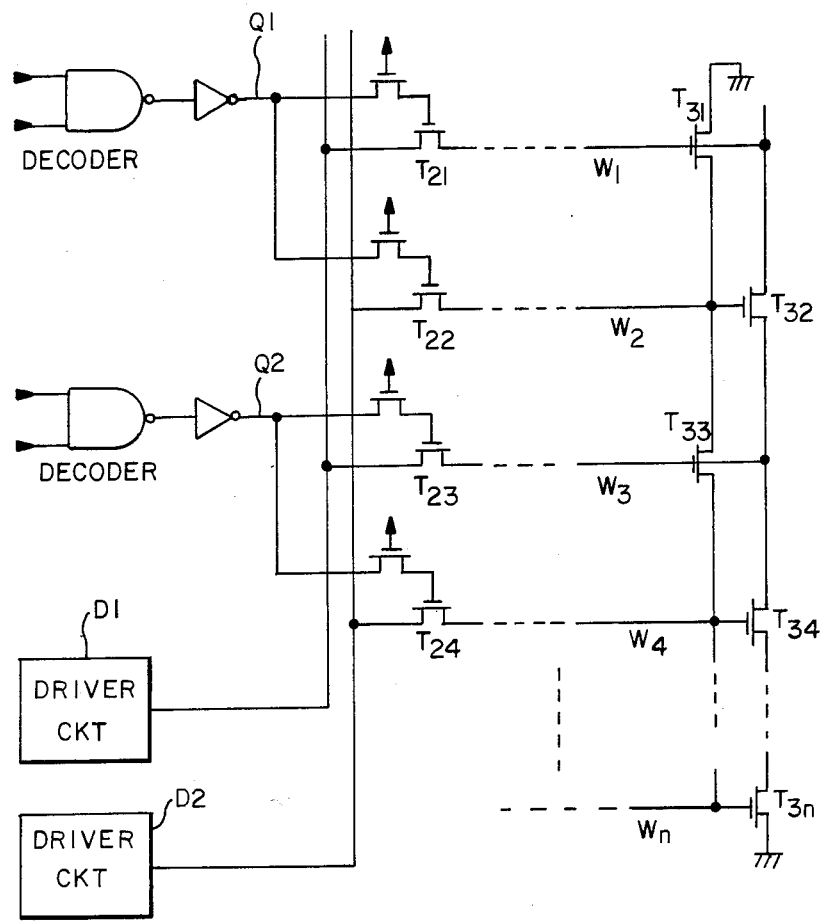
FIG.—1

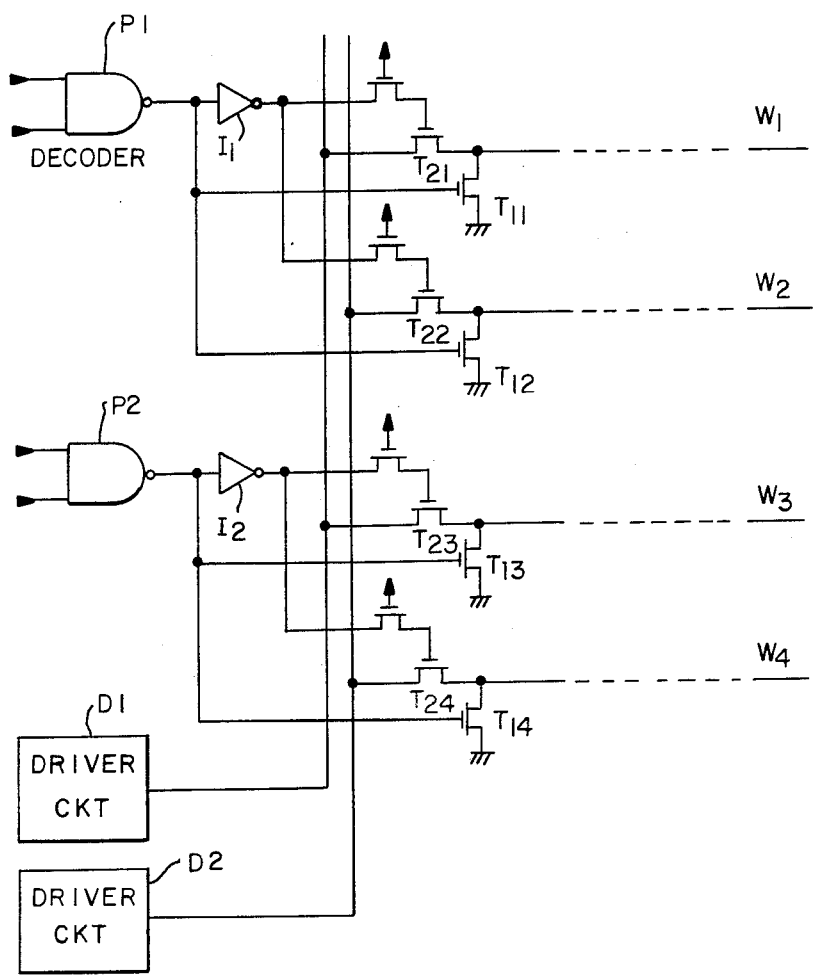
FIG. — 2  (PRIOR ART)

SEMICONDUCTOR IC DEVICE WITH WORD LINES SHIELDED FROM VOLTAGE CHANGES IN ADJACENT LINES

BACKGROUND OF THE INVENTION

This invention relates to a semiconductor integrated circuit (IC) device having a plurality of line selection signal lines (hereinafter referred to as word lines) and more particularly to such a semiconductor IC device which can prevent the voltage changes in a selected word line from affecting the adjacent non-selected word lines.

There are semiconductor IC devices in which many memory cells are arranged in a matrix formation within a chip such that one of these memory cells can be selected by means of an address signal for writing information on it or reading information from it. FIG. 2 shows a known word line selection circuit used in connection with a semiconductor IC circuit of this kind, having a large number of word lines $W_1, W_2, \ldots$ (only four word lines $W_1$–$W_4$ shown for the purpose of explanation) disposed parallel with respect to one another and many memory cells connected to each of these word lines.

In order that a desired one of these word lines can be selected, each of the lines $W_1$–$W_4$ has one end connected to one of MOS transistors $T_{11}$–$T_{14}$ and also one of MOS transistors $T_{21}$–$T_{24}$. The other terminals of the MOS transistors $T_{11}$–$T_{14}$ are grounded, their gates being connected respectively to the NAND output of a line decoder $P_1$ or $P_2$ and the other terminals of the other MOS transistors $T_{21}$–$T_{24}$ are connected to a set of word line driving circuits $D_1$ and $D_2$. The gates of the MOS transistors $T_{21}$–$T_{24}$ are connected to the output terminals of the inverters $I_1$ and $I_2$ through MOS transistors which serve as loads. The outputs from the aforementioned NAND gates $P_1$ and $P_2$ are applied to the input terminals of these inverters $I_1$ and $I_2$.

With a group of word lines thus structured, pairs of mutually adjacent lines such as $W_1$ and $W_2$, or $W_3$ and $W_4$, may be considered to form a set. Within each of these sets, an output signal from a same NAND gate such as $P_1$ or $P_2$ is applied to the gates of MOS transistors $T_{11}$ and $T_{12}$ or $T_{13}$ and $T_{14}$ and an inverse output signal to the gates of MOS transistors $T_{21}$ and $T_{22}$ or $T_{23}$ and $T_{24}$ through the inverter $I_1$ or $I_2$. One of each set of word lines such as $W_1$ and $W_3$ is connected to a first word line driving circuit $D_1$ and the other such as $W_2$ and $W_4$ to a second word line driving circuit $D_2$.

Operation of the circuit described above is explained next for the situation where the word line $W_2$ is selected.

In the beginning, the outputs from the NAND gates $P_1$ and $P_2$ are maintained at high levels, the outputs of the inverters $I_1$ and $I_2$ at low levels and the outputs of the word line driving circuits $D_1$ and $D_2$ also at low levels. When the word line $W_2$ is selected, the output from the line decoder $P_1$ connected to it changes to a low level and that of the inverter $I_1$ therefore becomes high such that the MOS transistors $T_{21}$ and $T_{22}$ are switched on. Thereafter, a high-level selection signal is outputted from the second word line driving circuit $D_2$ and this signal reaches the word line $W_2$ through the MOS transistor $T_{12}$. During this process, the word line $W_1$, to which the output from the same MAND gate $P_1$ is applied, is kept at a low level through the MOS transistor $T_{21}$ by the first word line driving circuit $D_1$ and the other word lines $W_3$ and $W_4$, to which the output from the NAND gate $P_2$ is applied are kepy at low levels respectively through the MOST transistors $T_{13}$ and $T_{14}$. In summary, the voltage levels of the adjacent word lines $W_1$, $W_3$ and $W_4$ do not rise due to capacitance between the lines (inter-line capacitance) even if the level of the word line $W_2$ is raised when this line is selected.

When a circuit of the aforementioned type is actually designed, however, the separations between adjacent word lines are controlled by the size of the memory cells and other factors and it is difficult to arrange MOS transistors within a limited space and to connect wires to their gates in order to apply signals from NAND gates to them. Recently, extremely small memory cells are coming to be used, for example, in dynamic RAMs. In such devices, separations between word lines become accordingly smaller and it becomes a serious problem to arrange MOS transistors properly inside such a device.

SUMMARY OF THE INVENTION

It is therefore an object of the present invention to provide a semiconductor IC device with a line selection circuit which can be laid out easily even if separations between word lines are small.

It is another object of the present invention to provide a semiconductor IC device with such a line selection circuit that the voltage levels of non-selected word lines are not influenced by the voltage changes of a selected word line through the inter-line capacitance.

The above and other objects of the present invention are achieved by forming a semiconductor IC device with MOS transistors such that a selected word line will be connected to the gate of one of them and the non-selected word lines adjacent to this selected word line will be connected to its source or drain and further such that at least one of these non-selected word lines is set at a fixed voltage level.

When a word line is selected with a circuit structured as described above, the selection signal serves to switch on the MOS transistor of which the gate is connected to the selected word line. The non-selected word lines adjacent to this selected word line remain at a low level, however, because at least one of them is maintained at a fixed voltage and this fixed voltage is applied to the other of them through the aforementioned MOS transistor which has been switched on, thereby electrically shielding the selected word line.

In summary, effects of inter-line capacitance do not appear on non-selected word lines even when the voltage level of a selected word line changes. The circuit pattern becomes extremely easy to lay out, furthermore, because the gate, source and drain of each MOS transistor for selecting or not selecting a word line are required to be in contact only with mutually adjacent word lines and hence the connecting lines for these MOS transistors need not be passed between the word lines.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a circuit diagram of a line selecting circuit for a memory device according to the present invention, and FIG. 2 is a circuit diagram of a known line selecting circuit.

DETAILED DESCRIPTION OF THE INVENTION

In what follows, the present invention is explained by way of FIG. 1 which describes a circuit for selecting one of a plurality of word lines. Such circuits may be used conveniently in connection with an integrated circuit having many unit circuits such as memory cells arranged in a matrix formation such that any one of them can be selected by specifying its row and column.

With reference to FIG. 1, word lines $W_i$ (i=1,2, ... N) are nearly parallel to one another and each of them ($W_i$) is connected at one end through a MOS transistor $T_{2i}$ to a first word line driving circuit $D_1$ if i is odd (or if $i=2n-1$ where n is a positive integer 1,2, ...) or to a second word line driving circuit $D_2$ if i is even (or i=2n). Each of the aforementioned MOS transistors $T_{2i}$ has its gate connected to the output terminal of a line decoder through a load MOS transistor. Since there are two word line driving circuits $D_1$ and $D_2$ as described above, the word lines are paired to form a plurality of groups such that each group contains two word lines and than the (2n−1)st and (2n)th word lines are combined to form the nth group. For example, word lines $W_1$ and $W_2$ are combined to form a (first) group and word lines $W_3$ and $W_4$ are combined to form another (second) group. Line decoder outputs $Q_n$ (n=1,2, ...) are applied correspondingly to these groups, that is, the output $Q_n$ is applied to the nth group containing the word lines $W_{2n-1}$ and $W_{2n}$. These line decoder outputs are applied to the gates of the aforementioned MOS transistors $T_{2i}$ as inverted signals obtained by inverting the outputs from respective NAND gates.

To each of these word lines $W_i$ is connected the gate of a MOS transistor $T_{3i}$, the source and drain of which are connected to the adjacent word lines $W_{i-1}$ and $W_{i+1}$. In other words, three mutually adjacent word lines $W_{i-1}$, $W_i$ and $W_{i+1}$ form a group and are connected respectively to the source, gate and drain of the MOS transistor $T_{3i}$. For example, the word line $W_{i+1}$ is connected to the gate of the MOS transistor $T_{3(i+1)}$, the source of this MOS transistor $T_{3(i+1)}$ is connected to the word line $W_i$ and its drain is connected to the word line $W_{i+2}$. The source and drain not connected to the word line $W_2$ or $W_{N-1}$ of the first and last of these MOS transistors $T_{31}$ and $T_{3N}$ are connected to a source of fixed voltage, or grounded. It is preferable that the aforementioned MOS transistors $T_{31}$ through $T_{3N}$ be disposed near the opposite ends of the word lines opposite to the line decoders for driving the word lines. It is to be reminded that of the two word line driving circuits $D_1$ and $D_2$, one is adapted to apply a voltage which is high enough for driving a selected word line but the other is for maintaining the non-selected word lines at a specified fixed voltage.

Operation of the circuit described above is explained next for the situation where the second word line $W_2$ is selected.

Initially, the outputs $Q_1$, $Q_2$, ... of the inverters as well as those of the word line driving circuits $D_1$ and $D_2$ are set at low levels. When the word line $W_2$ is selected, the output $Q_1$ of the line decoder connected to this word line $W_2$ becomes high and this switches on the MOS transistors $T_{21}$ and $T_{22}$. Thereafter, a high-level output is introduced from the second word line driving circuit $D_2$ and the selected word line $W_2$ is driven to a high level through the MOS transistor $T_{22}$ which has been switched on. With a high voltage applied to the word line $W_2$, the MOS transistor $T_{32}$ is switched on and the word lines $W_1$ and $W_3$ become electrically connected through its source and drain. Since the MOS transistor $T_{21}$ is now in the ON condition, the word line $W_1$ is kept at a low level by the first word line driving circuit $D_1$ and is not influenced by the voltage changes in the selected word line $W_2$. Since the other adjacent word line $W_3$ is connected to the word line $W_1$ through the MOS transistor $T_{32}$, it is kept at the same low level and is likewise unaffected by these voltage changes in the selected word line $W_2$. In other words, the selected word line $W_2$ is electrically shielded by the adjacent non-selected word lines $W_1$ and $W_3$. The other word line $W_4$, ... which are farther away are nearly completely free from the effects of the selected word line $W_2$ as a result of the electrical shielding. When one of the outermost word lines $W_1$ and $W_N$ is selected, a similar result is obtained because the source or drain of the corresponding MOS transistor $T_{31}$ or $T_{3N}$ is grounded.

In summary, the present invention disclosed an IC which includes a plurality of word lines and is operated by having one of these word lines selected without allowing the effects of voltage changes therein to reach the non-selected word lines. Each of the MOS transistors which are provided to keep the non-selected word lines at a fixed voltage level has its gate, source and drain connected to the adjacent word lines such that connecting wires need not be disposed across the word lines.

The foregoing description of a preferred embodiment of the invention has been presented for purposes of illustration and description. It is not intended to be exhaustive or to limit the invention to the precise form disclosed and many modifications and variations are possible in light of the above teaching. For example, any number (other than 2) of word lines may be grouped together to be connected to a line decoder output. If p (greater than 2) word line driving circuits $D_1$, ... $D_p$ are used such that p word lines are grouped together and connected to each of them and q line decoders are used to operate a total of N (=p×q) word lines $W_1$, ... $W_N$, these N word lines may be arranged similarly as shown in FIG. 1 such that the word line connected to the ith word line driving circuit $D_i$ and the jth line decoder ($1 \geq i \geq p$ and $1 \geq j \geq q$) is placed in the [(i−1)q+j]th position. According to the present invention, these N word lines, thus arranged, are connected together through N MOS transistors $T_{31}$, ... $T_{3N}$ as shown in FIG. 1. Such modifications and variations that may be apparent to a person skilled in the art are intended to be included within the scope of this invention.

What is claimed is:

1. In a semiconductor IC device for selecting one of a plurality of word lines sequentially arranged, the improvement wherein said device comprises MOS transistors each having a gate, a drain and a source, said gate being connected to a corresponding one of said word lines, said drain and source being connected individually to those of said word lines adjacent to said corresponding word line, and means coupled for maintaining at least one of said adjacent word lines at a fixed potential.

2. The semiconductor IC device of claim 1 wherein said fixed potential is ground potential.

3. The semiconductor IC device of claim 1 wherein said MOS transistors include first and last transistors with their gates connected individually to first and last ones of said word lines, said first and last transistors being connected to a fixed voltage source through either their drain or their source.

4. The semiconductor IC device of claim 3 wherein said fixed potential is ground potential.

5. The semiconductor IC device of claim 1 further comprising plural p number of sequentially arranged word line driving circuits and plural q number of sequentially arranged line decoders, the ith of said word line driving circuits and the jth of said line decoders being connected to $[(i-1)q+j]$th of said word lines, where $1 \geq i \geq p$ and $1 \geq j \geq q$.

6. The semiconductor IC device of claim 1 further comprising end MOS transistors having their gates connected to those of said word lines at the ends and being connected to a fixed voltage source through their source or their drain.

7. The semiconductor IC device of claim 6 wherein said fixed voltage source is at ground potential.

8. In a semiconductor IC device for selecting one of a plurality of sequentially arranged word lines, the improvement wherein said plurality of word lines include a second word line which is adjacent to and sandwiched between a first word line and a third word line, and said device comprises a MOS transistor having a gate, a drain and a source, said gate being connected to said second word line, said source being connected to said first word line and said drain being connected to said third word line, and means coupled for maintaining said first word line and/or said third word line at a fixed potential.

9. The semiconductor IC device of claim 8 wherein said fixed potential is ground potential.

10. The semiconductor IC device of claim 8 wherein said second word line is a selected word line, said first and third word lines are non-selected word lines, and said second word line is electrically shielded by said first and third word lines.

* * * * *